(12) United States Patent
Schulz

(10) Patent No.: US 9,735,778 B1
(45) Date of Patent: Aug. 15, 2017

(54) METHOD AND APPARATUSES FOR OPTIMIZING POWER MANAGEMENT ON AN INTEGRATED CIRCUIT DEVICE

(71) Applicant: Altera Corporation, San Jose, CA (US)

(72) Inventor: Jeffrey Schulz, Milpitas, CA (US)

(*) Notice: Subject to any disclaimer, the term of this patent is extended or adjusted under 35 U.S.C. 154(b) by 63 days.

(21) Appl. No.: 14/464,588

(22) Filed: Aug. 20, 2014

(51) Int. Cl.
*H03K 19/177* (2006.01)
*H03K 19/00* (2006.01)
*H03K 19/003* (2006.01)

(52) U.S. Cl.
CPC ....... *H03K 19/0008* (2013.01); *H03K 19/003* (2013.01); *H03K 19/17728* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 7,352,301 B2* | 4/2008 | Pappalardo | H04B 10/503 341/50 |
| 7,916,711 B2 | 3/2011 | Waxman et al. | |
| 7,916,956 B1 | 3/2011 | Hobbs et al. | |
| 8,320,435 B2 | 11/2012 | Zukunft et al. | |
| 8,442,111 B2 | 5/2013 | Garg et al. | |
| 8,706,958 B2* | 4/2014 | Hein | G06F 13/4243 711/104 |
| 8,731,773 B2 | 5/2014 | Yousefi et al. | |
| 8,761,284 B2 | 6/2014 | Zukunft et al. | |
| 2007/0115733 A1* | 5/2007 | Jang | G11C 7/1006 365/189.07 |
| 2007/0282932 A1* | 12/2007 | Rhim | G06F 13/385 708/200 |
| 2009/0147882 A1* | 6/2009 | Rha | H04L 25/4915 375/295 |
| 2013/0047046 A1* | 2/2013 | Goel | G11C 29/56 714/727 |
| 2013/0061006 A1* | 3/2013 | Hein | G06F 13/4243 711/154 |
| 2014/0089550 A1* | 3/2014 | Joshi | G11C 7/1006 710/308 |

* cited by examiner

*Primary Examiner* — Douglas W Owens
*Assistant Examiner* — James H Cho
(74) *Attorney, Agent, or Firm* — Vineet Dixit

(57) ABSTRACT

Input-output (IO) circuitry for optimizing power management on an integrated circuit is disclosed. The IO circuitry includes monitoring circuitry and a multiplexer circuit that is controlled by the monitoring circuitry. The monitoring circuitry determines whether majority of the bits of an IO signal are transitioning from a first logical state to a second logical state. When a number of bit transitions of the IO signal exceeds a predetermined bit transition threshold, the monitoring circuitry may send a monitoring circuitry output to the multiplexer circuit to selectively couple an output signal to either the IO signal or an inverted IO signal. The IO circuitry further includes an additional multiplexer that receives the monitoring circuitry output and a clock signal. The additional multiplexer selects an additional output signal from the monitoring circuitry output and the clock signal based on a control signal that indicates a power-savings operation.

21 Claims, 9 Drawing Sheets

METHOD AND APPARATUSES FOR OPTIMIZING POWER MANAGEMENT ON AN INTEGRATED CIRCUIT DEVICE

BACKGROUND

As demands for high performance integrated circuit devices grow, more and more components are placed in a single integrated circuit device. The improvement of semiconductor fabrication methods promotes multiple levels of integration that may enhance electronic device features and increase logic density and complexity in the integrated circuit. In some cases, the desired functionality of an electronic device or system may require the use of circuitry with more than one integrated circuit. To facilitate the implementation of such functionality, sometimes two or more integrated circuit dies may be used in such a system.

Generally, power consumption has a critical impact on integrated circuit performance. Typically, an integrated circuit device that is operating under high switching frequencies may require large switching currents to flow in the power and ground networks. This may result in increased power consumption that may inadvertently degrade performance and reliability of the integrated circuit device. Increased power consumption may also lead to increased electrical or electromagnetic noise that can adversely affect the integrated circuit device and/or neighboring integrated circuit components.

SUMMARY

In accordance with embodiments of the present invention, methods and apparatus for optimizing power management in an integrated circuit device are provided.

It is appreciated that the present invention can be implemented in numerous ways such as a process, an apparatus, a system, a device, or a method on a computer readable medium. Several inventive embodiments of the present invention are described below.

Input-output (IO) circuitry is disclosed. The IO circuitry includes monitoring circuitry and a multiplexer circuit that is controlled by the monitoring circuitry. The IO circuitry further includes a control circuit that provides a control signal to the monitoring circuitry where the control signal is indicative of a power-savings operation. The monitoring circuitry is operated in the power-savings operation to determine whether majority of the bits of an IO (data) signal are transitioning from a first logical state to a second logical state (e.g., by counting the number of bit transitions of the IO signal). When the number of bit transitions exceeds a predetermined bit transition threshold, the monitoring circuitry sends a monitoring circuitry output to the multiplexer circuit to selectively couple an output signal to either the IO signal or an inverted IO signal. The IO circuitry further includes an additional multiplexer circuit that receives the monitoring circuitry output and a clock signal. The control circuit may send the control signal to the additional multiplexer circuit to select an additional output signal from the monitoring circuitry output and the clock signal.

An integrated circuit is disclosed. The integrated circuit includes an input-output (IO) block connected to a group of IO pins that produces an IO signal and monitoring circuitry that is configured using a pin in the IO block to monitor switching activity of the IO signal. The integrated circuit further includes a control circuit that provides a control signal to the monitoring circuitry over the pin, where the control signal activates the monitoring circuitry to perform a power-savings operation. The monitoring circuitry may compare the IO signal to a predetermined IO signal to determine whether a number of bit transitions in the IO signal exceeds a predetermined bit transition threshold during the power-savings operation. When the predetermined bit transition threshold is exceeded, the monitoring circuitry produces a monitoring circuitry output and sends it to a multiplexer circuit. The multiplexer circuit may selectively couple an output signal to either the IO signal or an inverted IO signal based on the monitoring circuitry output. Subsequently, the output signal is transmitted out from the integrated circuit and received by another integrated circuit that is coupled to the integrated circuit.

A method for monitoring power consumption of an integrated circuit is provided. The method includes producing an input-output (IO) signal with an IO block connected to a group of IO pins. The power consumption associated with the IO block may be monitored using monitoring circuitry. The monitoring circuitry may receive the IO signal and monitor switching activities of the IO pins based on the IO signal. The method may further include receiving the IO signal and an inverted IO signal with a multiplexer circuit, where the multiplexer circuit is controlled by the monitoring circuitry to selectively couple an output signal to either the IO signal or the inverted IO signal based on a monitoring circuitry output that is asserted by the monitoring circuitry when a number of bit transitions in the IO signal exceeds a predetermined threshold.

Further features of the invention, its nature and various advantages, will be more apparent from the accompanying drawings and the following detailed description of the preferred embodiments.

DETAILED DESCRIPTION

The embodiments provided herein include circuitry and techniques for optimizing power management on an integrated circuit device.

It will be obvious to one skilled in the art that the present exemplary embodiments may be practiced without some or all of these specific details. In other instances, well-known operations have not been described in detail in order not to unnecessarily obscure the present embodiments.

Figure 1:
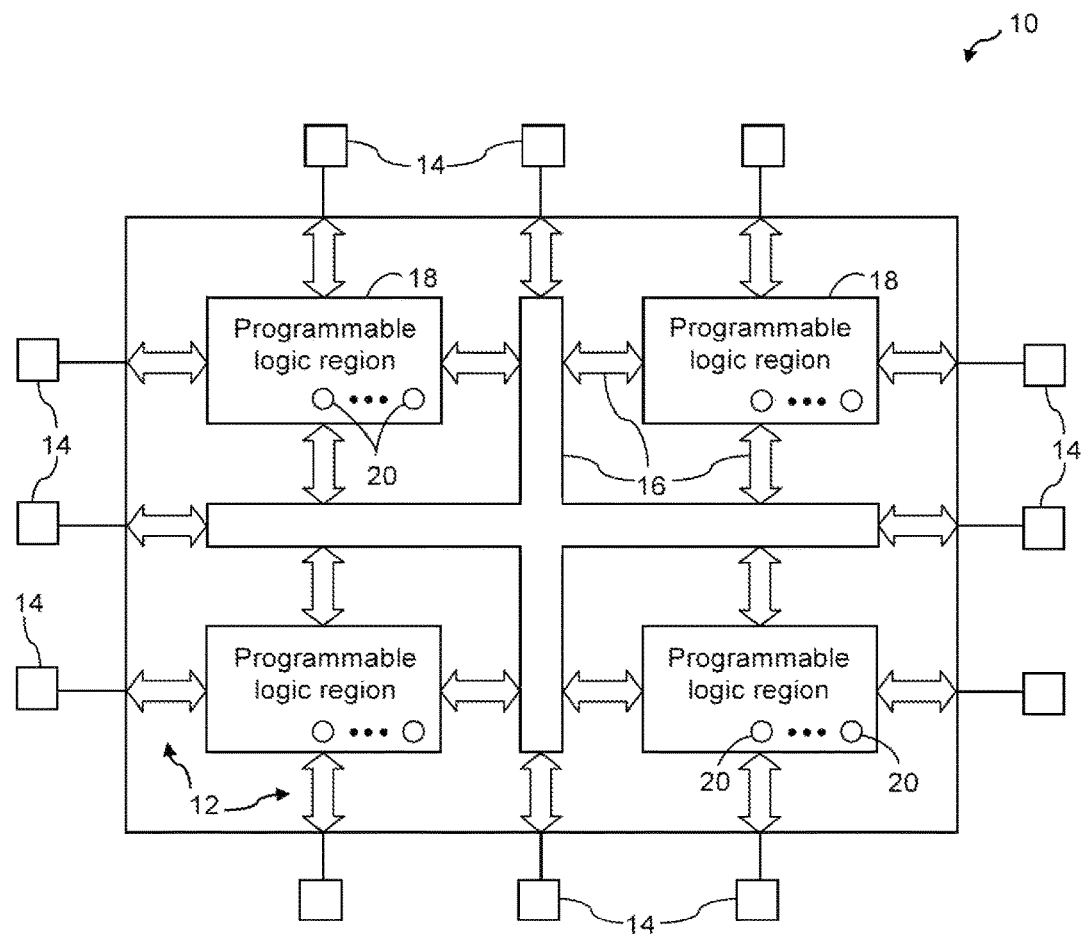
FIG. 1 is a diagram of an illustrative integrated circuit in accordance with an embodiment of the present invention.

FIG. 1 is a diagram of an illustrative integrated circuit 10 in accordance with an embodiment of the present invention. Integrated circuit 10 may have input-output (IO) circuitry 12 for driving signals off of integrated circuit 10 and for receiving signals from other circuits or devices via input-output pins 14.

Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of programmable logic device, the memory elements may store configuration data and are therefore sometimes referred to as configuration random-access memory (CRAM) cells. In general, configuration random-access memory elements 20 may be arranged in an array pattern. In a programmable logic device, there may be millions of memory elements 20 on a single device. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

Horizontal and vertical conductors and associated with control circuitry of integrated circuit 10 may be used to access memory elements 20 when memory elements 20 are arranged in an array. The control circuitry, for example, may be used to clear all or some of the memory elements. The control circuitry may also write data to memory elements 20 and may read data from memory elements 20. Memory elements 20 may be loaded with configuration data, for instance, in CRAM arrays. The loaded configuration data may then be read out from the memory array to confirm proper data capture before integrated circuit 10 is used during normal operation in a system.

Integrated circuit 10 may be organized using any suitable architecture. For example, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a lookup table, registers, and programmable multiplexers. If desired, programmable logic regions 18 may be arranged in more levels or layers in which multiple large regions are interconnected to form still larger portions of logic.

In one embodiment, IO circuitry 12 may include one or more input-output (IO) blocks (not shown). Such blocks provide a mechanism for coupling two or more integrated circuits. Generally, a sufficient level of power is required to allow high-speed IO signals to be sent between the two or more integrated circuits through the IO blocks. However, there is a concern of excessive switching activities in the IO blocks. This may cause high switching power consumption in the integrated circuit. In another instance, each of the IO blocks may have a clock output for syncing other digital components in the integrated circuit. In many applications, however, most of the clock outputs are unused. Therefore, a power-savings mechanism may minimize power consumption in the integrated circuit by utilizing the unused clock outputs in the IO blocks.

Figure 2:
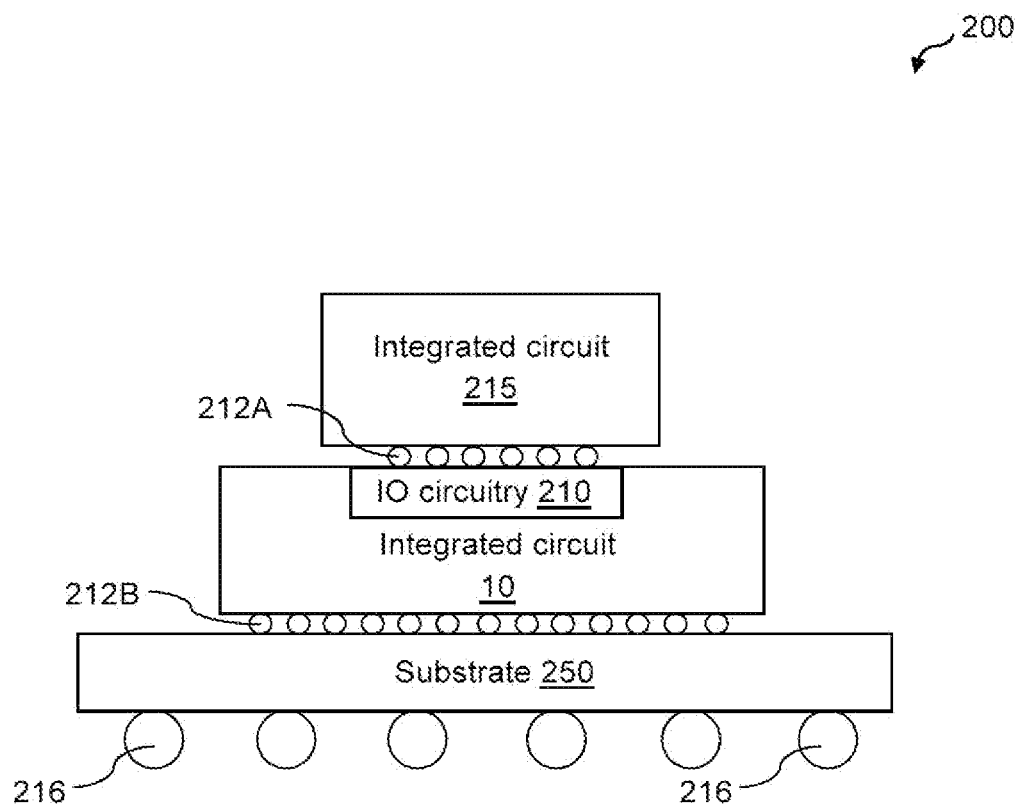
FIG. 2 is a cross-sectional view of an illustrative three-dimensional (3D) package in accordance with an embodiment of the present invention.

Integrated circuits may be stacked to form a three-dimensional (3D) package. FIG. 2 is a cross-sectional view of an illustrative three-dimensional (3D) integrated circuit package 200 in accordance with an embodiment of the present invention.

As shown in FIG. 2, package 200 may include integrated circuit 10 with an additional integrated circuit 215 stacked on top of integrated circuit 10. Integrated circuit 10 may be disposed over substrate 250 (e.g., integrated circuit 10 may be mounted on substrate 250 in a flip-chip configuration). Integrated circuit 215 may be disposed over programmable integrated circuit 10. It should be appreciated that more integrated circuits may be used and stacked vertically in package 200.

Integrated circuit 10 may include IO circuitry 210. IO circuitry 210 may couple to another circuitry (not shown) in integrated circuit 215. In one embodiment, the another circuitry in integrated circuit 215 may be IO circuitry 210. IO circuitry 210 in integrated circuit 10 may provide a variety of desired or specific functionalities. For example, the circuitry in integrated circuit 10 may include digital circuitry (e.g., gates, latches, flip flops, registers, etc.), analog circuitry (e.g., amplifiers, adders, etc.), mixed-signal circuitry (e.g., analog-to-digital converters (ADCs), digital-to-analog converters (DACs), etc.), and/or discrete components (e.g., transistors, resistors, capacitors, inductors, etc.).

Interconnects 212A may be placed between integrated circuits 10 and 215 while interconnects 212B may be placed between integrated circuit 10 and substrate 250. In one embodiment, interconnects 210A and 210B may act as communication pathways between integrated circuit 10, integrated circuit 215, and substrate 250. For example, interconnects 212A and 212B may be micro bumps. Additional interconnects 216 (e.g., solder balls), which are disposed on the bottom surface of substrate 250, may provide a way for substrate 250 to couple to another medium, such as a printed circuit board (not shown). Even though a 3D integrated circuit package is shown in the embodiment of FIG. 2, it should be noted that different package configurations may be employed. For example, two or more integrated circuits may be placed adjacent to each other in a 2.5D integrated circuit package.

Figure 3:
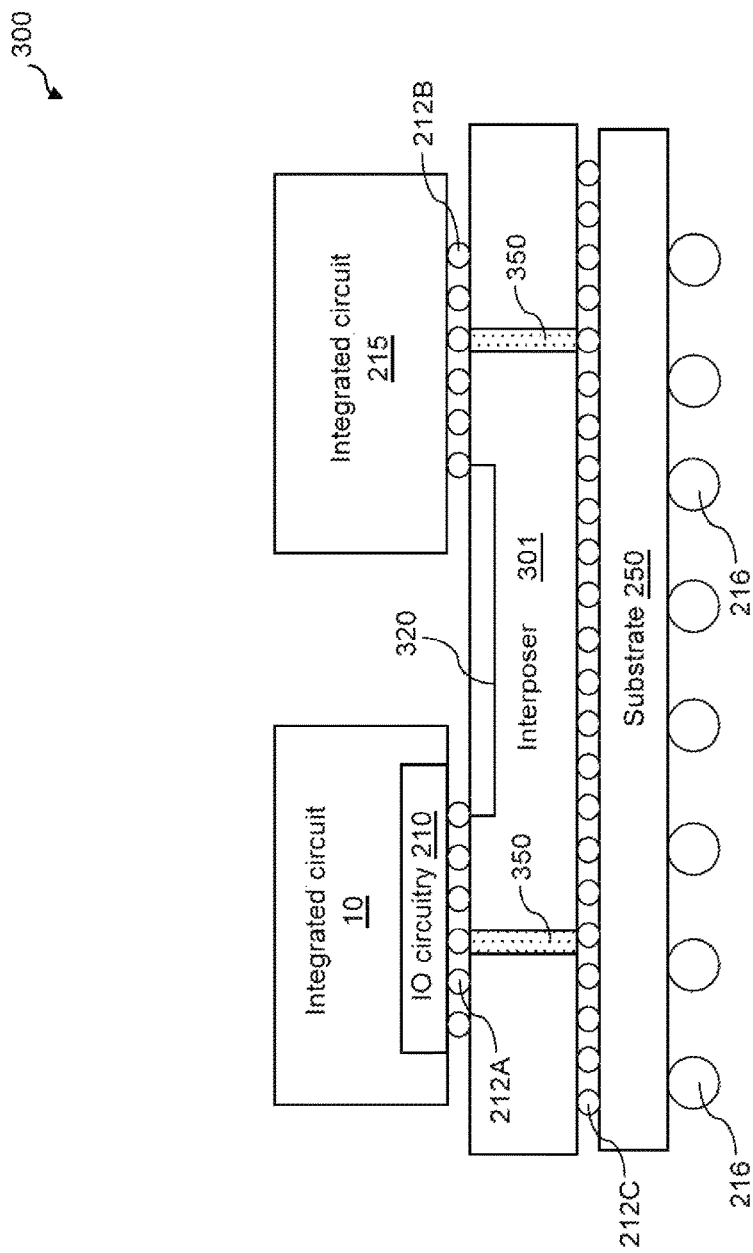
FIG. 3 is a cross-sectional view of an illustrative 2.5D package in accordance with an embodiment of the present invention.

FIG. 3 is a cross-sectional view of illustrative 2.5D package 300 in accordance with an embodiment of the present invention. Package circuitry such as package 300 that includes interposer 301 may sometimes be referred to as a 2.5D package. Similar to the arrangement shown in FIG. 2, package 300 includes integrated circuits 10 and 215, interconnects 212A-212C, and interconnects 216. It should be appreciated that for the sake of brevity, components already shown in integrated circuits 10 and 215 of FIG. 2 (e.g., IO circuitry 210 and interconnects 212A, 212B, and 216) and described above will not be repeated.

Interposer 301 may be mounted on substrate 250. Interconnects 212C may be used for attaching interposer 301 to substrate 250. Integrated circuits 10 and 215 are placed adjacent to each other on interposer 301. In one embodiment, interposer 301 may couple to IO circuitry 210 in integrated circuit 10 via interconnects 212A. Interposer 301 may include a variety of coupling mechanisms that couple IO circuitry 210 to integrated circuit 215. For example, the coupling mechanism of interposer 301 may include one or more conductive traces 320 and one or more through-silicon vias (TSVs) 350 to transmit signals between integrated circuits 10 and 215. Signals between IO circuitry 210 of integrated circuit 10 and integrated circuit 215 may be routed via interposer 301.

Figure 4:
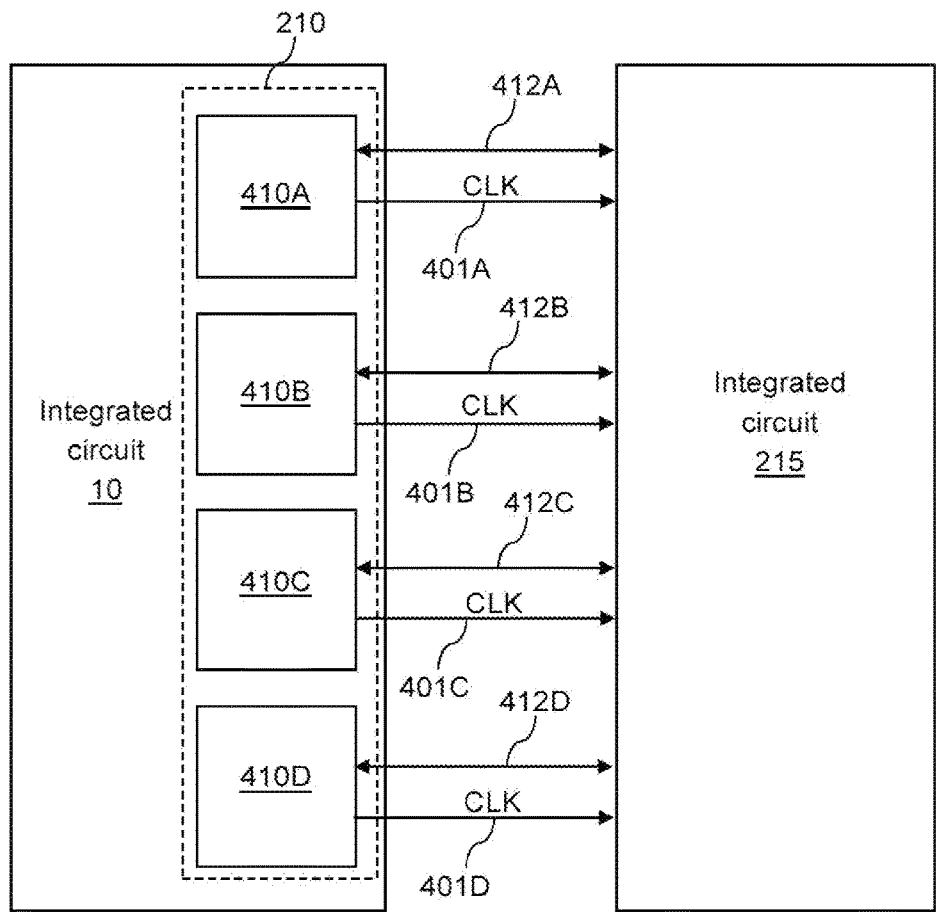
FIG. 4 shows an integrated circuit having input-output (IO) blocks coupled to another integrated circuit in accordance with an embodiment of the present invention.

FIG. 4 shows integrated circuit 10 with IO blocks 410A-410D coupled to integrated circuit 215 in accordance with an embodiment of the present invention. IO blocks 410A-410D may be part of IO circuitry 210 of FIGS. 2 and 3. Each of IO blocks 410B-410D may operate similarly to each other. It should be appreciated that even though four IO blocks (e.g., IO blocks 410A-410D) are shown in the embodiment of FIG. 4, depending on the required functionality of the integrated circuit, fewer or more IO blocks may be used.

In one embodiment, each of IO blocks 410A-410D may provide a mechanism for circuitry (not shown) in integrated circuit 10 to communicate with circuitry (not shown) in other integrated circuits (e.g., integrated circuit 215). For example, each of IO blocks 410A-410D may have data/power paths (as exemplified by interconnects 412A-412D) for integrated circuits 10 and 215 to transmit and receive information and power signals. This is to accommodate a variety of designs and specifications for the number of data/power paths coupled between integrated circuit 10 and integrated circuit 215. For example, interconnects 412A-412D may be microbumps. Interconnects 412A-412D may provide either unidirectional or bidirectional communication between integrated circuits 10 and 215. Additionally, each of IO blocks 410A-410D may output a clock signal CLK from integrated circuit 10 to integrated circuit 215. For example, IO block 410A may output clock signal CLK 401A, IO block 410B may output clock signal CLK 401B, IO block 410C outputs clock signal CLK 401C, and IO block 410D may output clock signal CLK 401D. In another embodiment, each of IO blocks 410A-410D may also receive external clock signals (not shown) from integrated circuit 215 as timing reference. A more detailed description of IO block 410A is provided below with reference to FIG. 5A.

Figure 5A:
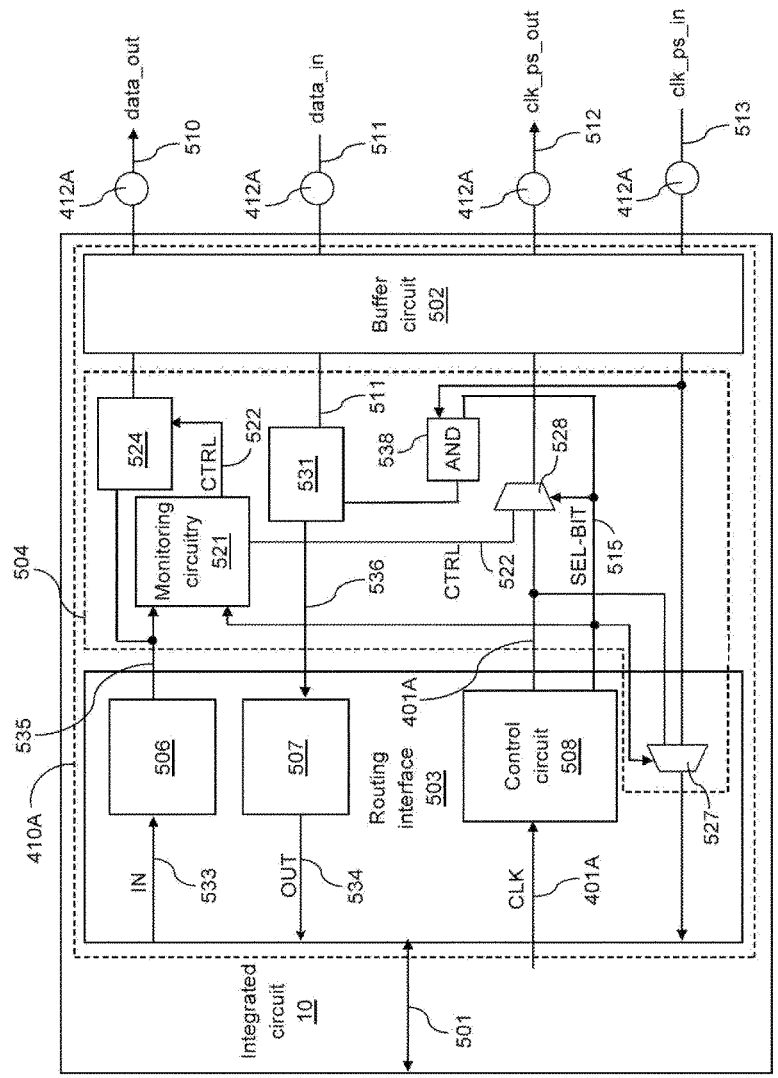
FIG. 5A shows an illustrative integrated circuit with a detailed circuit diagram of an input-output (IO) block in accordance with an embodiment of the present invention.

FIG. 5A shows an integrated circuit with a detailed circuit diagram of IO block 410A of FIG. 4 in accordance with an embodiment of the present invention. As described above, IO block 410A includes a desired number of interconnects 412A. For example, interconnects 412A may include one or more unidirectional output lines (e.g., data_out 510, clk_ps_out 512) for output signals and unidirectional input lines (e.g., data_in 511, clk_ps_in 513) for input signals. In other instances, interconnects 412A may also include bidirectional lines and power lines, which are omitted from FIG. 5A so as to not unnecessarily obscure the description of the present invention. In the embodiment shown in FIG. 5A, IO block 410A includes buffer circuit 502, control circuit 508, routing interface 503, and power-savings circuitry 504.

Buffer circuit 502 may be coupled to some or all of interconnects 412A. In one embodiment, buffer circuit 502 may provide bidirectional buffer functionality (e.g., input and output buffer functionality) by buffering, level-shifting (e.g., to accommodate differing voltage levels of the signal source and destination circuits), and/or conditioning of signals from other circuitry in integrated circuit 10 in order to provide or transmit those signals to an external element (e.g., integrated circuit 215 of FIG. 4) that may be coupled to integrated circuit 10, and vice-versa.

Routing interface 503 may couple to control circuit 508 and to other circuitry (other than IO block 410A) in integrated circuit 10. In one embodiment, routing interface 503 provides a mechanism for circuitry in integrated circuit 10 to communicate with control circuit 508 and ultimately, with an external element (e.g., integrated circuit 215 of FIG. 4). For example, routing interface 503 may include serializer circuits (e.g., serializer circuit 506), deserializer circuits (e.g., deserializer circuit 507), buffers, registers, and other circuitry.

Control circuit 508 may provide control and supervisory functions to IO circuit 410A. As shown in FIG. 5A, control circuit 508 is coupled to buffer circuit 502 and routing interface 503. As an example, control circuit 508 may control data signals (e.g., IN 533) that are provided to the external element via buffer circuit 502 using control signal SEL-BIT 515. Additionally, control circuit 508 may output clock signal CLK 401A for signal synchronizing operations in IO block 410A. In another example, control circuit 508 may also control data signals 534 that are received from the external element via buffer circuit 502 using SEL-BIT 515.

In an exemplary embodiment, power-savings circuitry 504 is coupled to IO block 410A to monitor power consumption when receiving and transmitting IO signals. Power-savings circuitry 504 may include monitoring circuitry 521, power reduction encoding structures 524 and 531, logic gate 538, and multiplexer circuits 527 and 528. The power reduction encoding structure 524 receives the signal 535 from the serializer circuit 506 and optionally encodes it, if the CTRL signal is asserted by the monitoring circuitry 521. Similarly, power reduction decoding structure 531 receives signal 511 from the buffer circuit 502 and optionally decodes it, if the received signal 511 is in an encoded format. In certain embodiments, monitoring circuitry 521 monitors the number of bits that are transitioning from a first logical state to a second logical state, and asserts the CTRL signal if the number of bits transitioning exceeds a predetermined threshold number of bits. In alternative embodiments, the predetermined threshold number of bits is set to be half the number of bits in the IO signal, resulting in the CTRL signal being asserted if a majority of the bits in the IO signal are transitioning from the first logical state to the second logical state. Therefore, in various embodiments, power reduction encoding structure 524 performs the optional encoding and decoding based on either the number of bits of the IO signal transitioning from the first logical state to the second logical state exceeding the predetermined threshold number of bits, or the majority of the bits of the IO signal transitioning from the first logical state to the second logical state, in accordance with the CTRL signal asserted by monitoring circuitry 521.

Power reduction encoding circuit 524 can perform either analog or digital encoding to generate an encoded signal that requires lower power consumption for transmission as compared to that of the un-encoded signal (i.e. the received signal 535). Similarly, if the data_in signal 511 has been encoded for lower power consumption during transmission (e.g., as indicated by the input signal clk_ps_in) then the power reduction decoding structure decodes the received signal to generate the original unencoded signal. As shown in FIG. 5A, power-savings circuitry 504 is coupled between routing interface 503 and buffer circuit 502. A more detailed description of the components of power-savings circuitry 504, as well as the input data signals (e.g., IN 533 and data_in 511), output data signals (e.g., OUT 534 and data_out 510), data bit signals (e.g., bit signals 535 and 536), and control bit signals (e.g., CTRL 522, clk_ps_512, and clk_ps_in 513) shown in FIG. 5A will be described below with reference to FIGS. 5B and 5C.

Various embodiments described below illustrate power reduction encoding and decoding circuits that digitally encode or decode signals, respectively, by selectively inverting bits of the signal in a predetermined cycle based on the number of bit transitions between the predetermined cycle and the preceding cycle. However, alternate embodiments may use other types of digital or analog encoding to reduce power consumption. For example, in one embodiment, the power reduction encoding circuit can switch between transmitting a low swing differential signal and a single ended signal based on whether more or less than half the bits in a transmitted word transition during a predetermined cycle as compared to a preceding cycle. Similarly, the power reduction decoding circuit can switch between single ended and differential received signals based on the format of the received signal. Alternative embodiments can provide more than one analog and/or digital encoding for power reduction, and a power monitoring circuitry can select the encoding that results in the lowest power consumption.

Figure 5B:
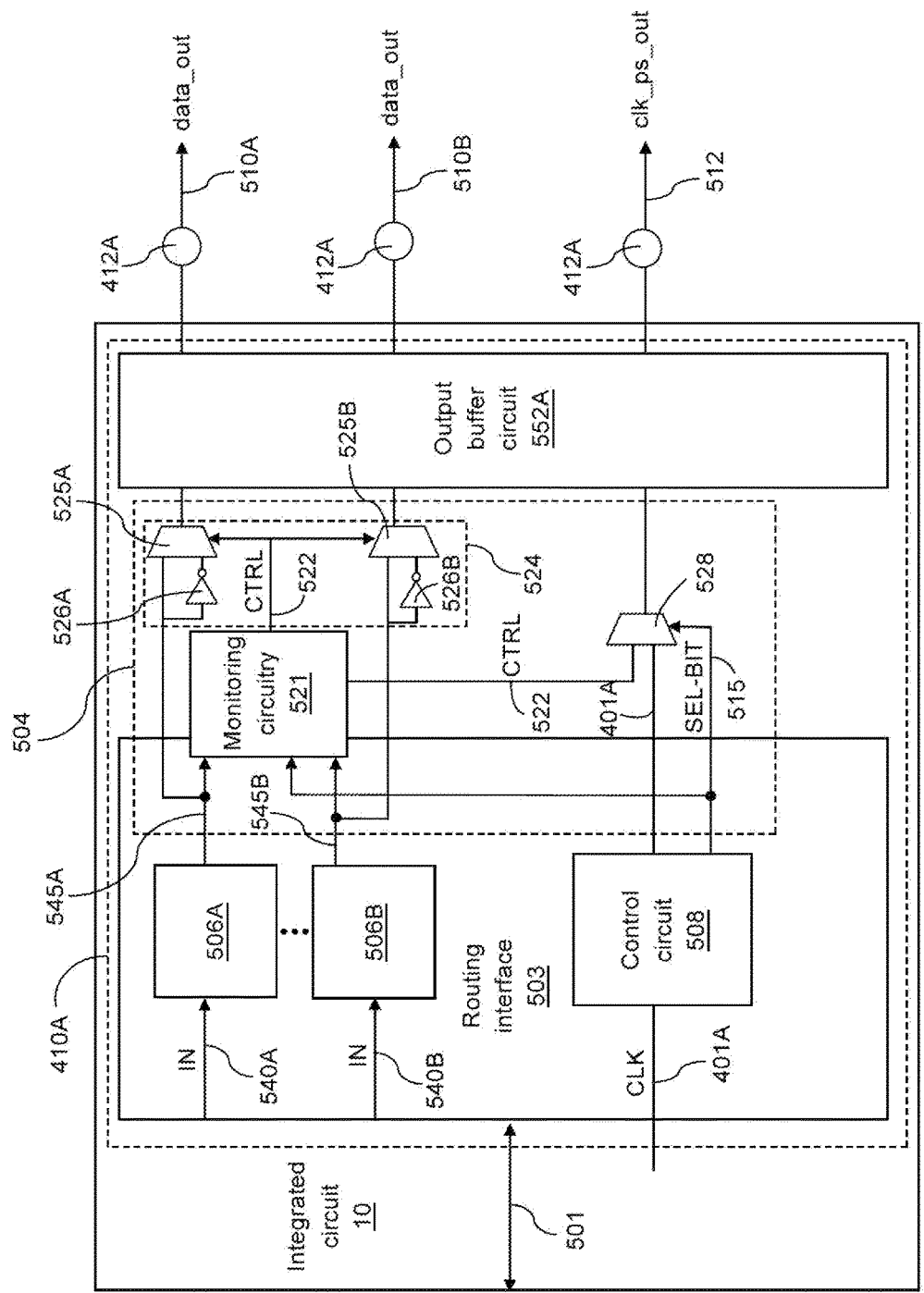
FIG. 5B shows an illustrative input-output (IO) block that transmits a signal out of an integrated circuit in accordance with an embodiment of the present invention.

FIG. 5B shows illustrative input-output (IO) block 410A of FIG. 5A that transmit a signal out of integrated circuit 10 of FIG. 4 in accordance with an embodiment of the present invention. It should be appreciated that for the sake of brevity, components already shown in integrated circuit 10 and described above (e.g., routing interface 503, and interconnects 412A) will not be repeated. As shown in FIG. 5B, power-savings circuitry 504 is coupled between routing interface 503 and output buffer circuit 552A of buffer circuit 502 of FIG. 5A to monitor power consumption when transmitting signals out of integrated circuit 10. During signal transmission, the power-savings mechanism of power-savings circuitry 504 may involve monitoring circuitry 521, power reduction encoding structure 524, and multiplexer circuit 528.

In one embodiment, an IO (data) signal being transmitted out of integrated circuit 10 may be a 41-bit signal (e.g., 40 data bits plus 1 clock signal) that is transmitted to routing interface 503 from other parts of IC 10 via link 501. As an example, data signals IN 540A and 540B may first be received by serializer circuits 506A and 506B, respectively, in routing interface 503. In the example shown in FIG. 5B, each of serializer circuits 506A -506B may be configured to operate as a 4:1 serializer circuit. It should be appreciated that only two serializer circuits are shown in the embodiment of FIG. 5B to simplify the following description, even though ten serializer circuits may be employed in practice. It should also be appreciated that the type of serializer circuits used may be different than the above, depending on the number of bits received and the number of bits to be transmitted out from integrated circuit 10.

In one embodiment, control circuit 508 may control monitoring circuitry 521 by sending a control signal (e.g., SEL-BIT 515) that is indicative of a power-savings operation to monitoring circuitry 521. During the signal transmission operation, each of serializer circuits 506A and 506B may select one of four serial data bits from the received data signal, respectively, and provide the selected bit (e.g., data bit 545A, data bit 545B) to monitoring circuitry 521 and subsequently power reduction encoding structure 524. As shown in FIG. 5B, power reduction encoding structure 524 may include multiplexer circuits 525A and 525B and inverter circuits 526A and 526B. In one embodiment, each serializer circuit may have a multiplexer circuit and inverter circuit. Therefore, it should be appreciated that only two multiplexer circuits (e.g., multiplexer circuits 525A and 525B) are shown in the embodiment of FIG. 5B to simplify the following description, even though additional (e.g., ten) multiplexer circuits may be employed in practice.

When the power-savings operation is activated, monitoring circuitry 521 may monitor power consumption associated with IO block 410A based on a serial stream of 10-bit signal, which are formed from the selected bits from serializer circuits 506A and 506B. For example, monitoring circuitry 521 may monitor switching activities of IO (data) pins (not shown) in serializer circuits 506A-506B by comparing the serial stream of 10-bit signal of a current signal cycle to that from a previous signal cycle to determine whether a predetermined bit transition threshold is exceeded. The predetermined bit transition threshold, for example, may be half of the total number of bits (e.g., 5 bits) in the 10-bit signal, which may be stored in a register, for example, within monitoring circuitry 521. This example is merely illustrative. If desired, any number of data bits may be compared to historical data in determining whether bit transitions exceed a threshold.

Table 1 below shows a comparison between input and output bit signals of monitoring circuitry 521 at first and second signal cycles (as denoted by "T1" and "T2", respectively) before power-savings circuitry 504 is activated on IO block 410A.

TABLE 1

| | Signal cycle (T) | |
|---|---|---|
| | T1 | T2 |
| Input bit signal | 00_0000_1111 | 11_1010_0000 |
| Output bit signal | 00_0000_1111 | 11_1010_0000 |

Based on the example shown in Table 1, the output bit signal remains unchanged from its input bit signal at T1 and T2, respectively, when no power-savings operation is activated on IO block 410A. However, in this example, 8 bits of the 10 bits of the input bit signal are switched from to T1 to T2, which has exceeded the predetermined number of bit transition (e.g., 5 bits). As such, more power consumption may be required for signal transmission. In one scenario, power-savings operation may be activated on IO block 410A in order to minimize switching power of the output data at T2, as indicated above.

Table 2 below shows another comparison between the same input bit signals (as shown in Table 1) and output bit signals of monitoring circuitry 521 at first and second signal cycles (as denoted by "T1" and "T2", respectively) after power-savings circuitry 504 is activated on IO block 410A.

TABLE 2

| | Signal cycle (T) | |
|---|---|---|
| | T1 | T2 |
| Input bit signal | 00_0000_1111 | 11_1010_0000 |
| Output bit signal | 00_0000_1111_0 | 11_0101_1111_1 |

As described above in Table 1, monitoring circuitry 521 may detect that the number of bit transitions of the input bit signal at T2 has exceeded the predetermined bit transition threshold by comparing the input bit signal at T2 with a predetermined data signal (e.g., input bit signal at T1). In this scenario, monitoring circuitry 521 may assert a monitoring circuitry output (e.g., monitoring circuitry output 520) to multiplexer circuit 525A and 525B to select an inverted form of the input bit signal. For example, multiplexer circuits 525A and 525B may select the inverted input from inverter circuits 526A and 526B, respectively, which will invert the initial input bit signal (e.g., "11_1010_0000") at T2 to generate an inverted data signal (e.g., "00_0101_1111").

Additionally, the output bit signal is extended by an additional bit, which may indicate that the output bit signal is inverted from the input bit signal. As shown in Table 2, the additional bit of "1" at the end of the output bit signal at T2 indicates that the output bit signal is inverted from the input bit signal. For example, as shown in FIG. 5B, monitoring circuitry 521 may assert a monitoring circuitry output (e.g., CTRL 522), which is represented by the additional bit in the output bit signal shown in Table 2, to multiplexer circuit 528. Generally, power savings may be achieved when there are fewer bit transitions. As shown in Table 2, only 2 bits out of 10 bits of the output bit signal are switched from T1 to T2. Such a configuration may result in power savings in integrated circuit 10, since it may require less power to transmit the inverted output bit signal out of integrated circuit 10.

In the case of an unused clock output (e.g., clock signal 401A) in IO block 410A, multiplexer circuit 528 may select CTRL 522, based on SEL-BIT 515, as an output bit signal. In one embodiment, the resulting output bit signal may serve as an indicator that identifies whether the selected output data signal has been inverted from the power-savings operation (e.g., so that another integrated circuit may use the output signal in determining whether data signals produced by output buffer circuit 552A are inverted). Subsequently, the selected output data signals from multiplexer circuits 525A-525B and the selected output control bit signal from multiplexer circuit 528 are sent to output buffer circuit 552A and transmitted out from integrated circuit 10 as data_out 510A-510B and clk_ps_out 512, respectively.

Figure 5C:
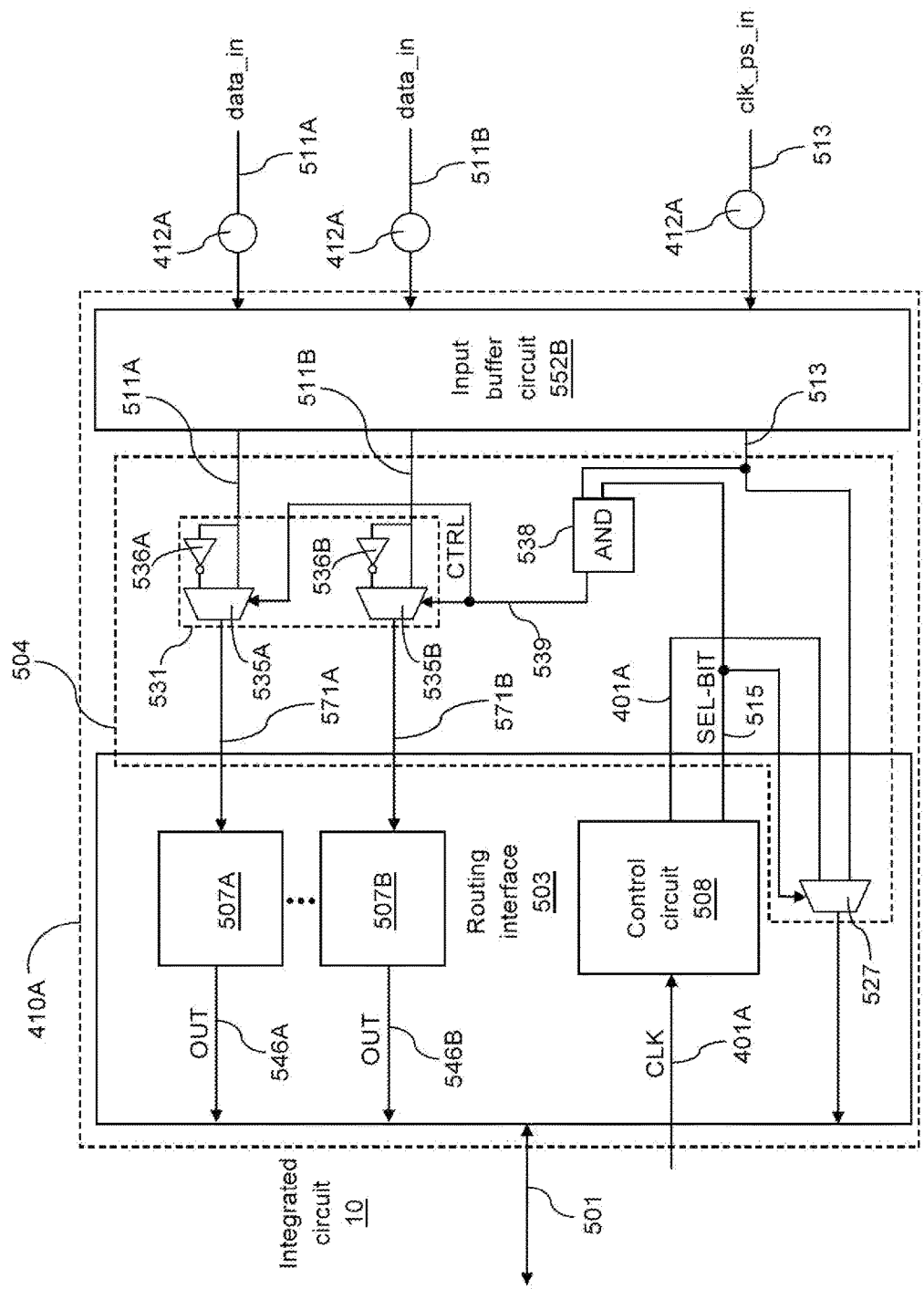
FIG. 5C shows an illustrative input-output (IO) block that receives a signal in accordance with one embodiment of the present invention.

FIG. 5C shows an illustrative input-output (IO) block 410A of FIG. 4 that receives a signal in accordance with an embodiment of the present invention. It should be appreciated that for the sake of brevity, components already shown in the integrated circuit 10 of FIG. 4 and described above (e.g., routing interface 503, and interconnects 412A) will not be repeated.

As shown in FIG. 5C, power-savings circuitry 504 is coupled between routing interface 503 and input buffer circuit 552B of buffer circuit 502 of FIG. 5A to monitor power consumption when IO (data) signals are received by integrated circuit 10. When input signals are received, the power-savings mechanism of power-savings circuitry 504 may involve multiplexer circuit 527, logic gate 538, and multiplexing structure 531. Accordingly, multiplexing structure 531 may further include multiplexer circuits 535A and 535B and inverter circuits 536A and 536B.

As shown in FIG. 5C, input data signals (e.g., data_in 511A, and data_in 511B) may be received by input buffer circuit 552B and transmitted to multiplexer circuits 535A and 535B. Accordingly, an input bit signal (e.g., clk_ps_in 513) is also received by input buffer circuit 552B of integrated circuit 10. As an example, clk_ps_in 513 may indicate that the received input data signals are inverted data signals, which means a power-savings operation may have been performed in the transmitting circuit (not shown in FIG. 5C). In another example, clk_ps_in 513 may be a clock signal.

Bit signal clk_ps_in 513 is then transmitted to logic gate 538. At logic gate 538, clk_ps_in 513 is AND-ed together with SEL-BIT 515 to produce a control signal (e.g., CTRL 539) to multiplexer circuits 535A and 585B. In one embodiment, CTRL 539 may control multiplexer circuits 535A and 535B to select an inverted form of the input data signals (e.g., data_in 511A and 511B) so that the correct output data signal can be transmitted to other parts of integrated circuit 10.

Additionally, clk_ps_in 513 may also be transmitted to multiplexer circuit 527. In one embodiment, clock signal 401A is selected by multiplexer circuit 527 to be used as a clock for integrated circuit 10 when SEL-BIT 515 is asserted. Such a configuration may be used when a power-savings operation has been performed in the transmitting circuit (e.g., an off-chip element coupled to integrated circuit 10), whereby clk_ps_in 513 is a resulting output bit signal from the other circuit, which may indicate that the received input data signals (e.g., data_in 511A-511B) are inverted input data signals.

Subsequently, the selected output data bit signals (e.g., output data bit signals 571A and 571B) from multiplexer circuits 535A and 535B are routed to deserializer circuits 507A and 507B for further processing. In the example shown in FIG. 5C, each of deserializer circuits 507A-507B may be configured to operate as a 4:1 deserializer circuit, respectively. Therefore, it should be appreciated that only two deserializer circuits are shown to simplify the following description, even though more (e.g., ten) deserializer circuits may be employed in practice. Generally, deserializer circuits such as deserializer circuits 507A-507B are configured to perform serial to parallel signal conversion. As shown in FIG. 3C, deserializer circuits 507A-507B may convert the output bit signals 571A and 571B from multiplexer circuits 535A and 535B into parallel output data signals (e.g. OUT 546A and OUT 546B). OUT 546A and 546B are subsequently routed to other circuitry (not shown) in integrated circuit 10 via link 501.

Figure 6:
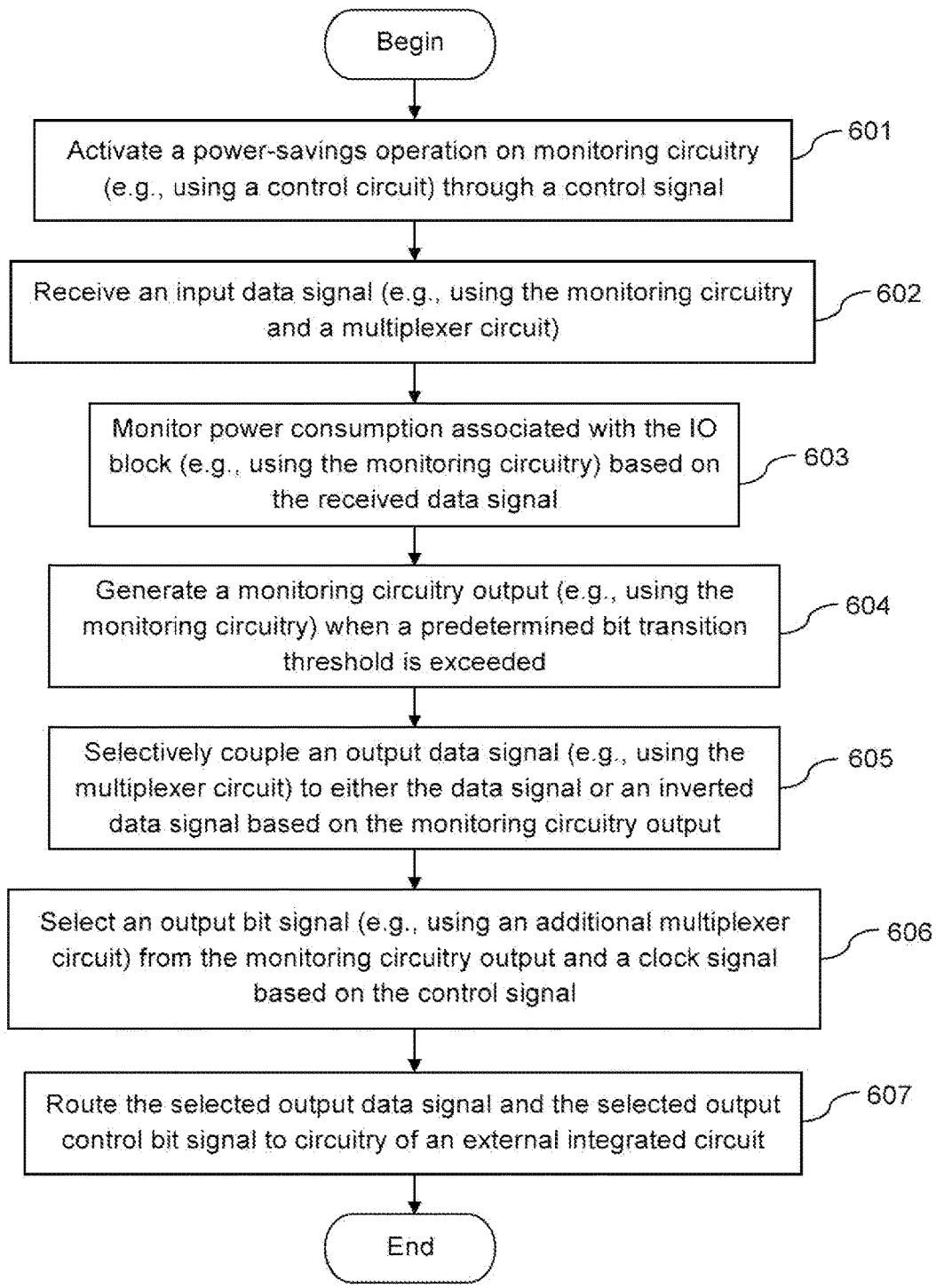
FIG. 6 is an illustrative method for monitoring power consumption on an integrated circuit in accordance with an embodiment of the present invention.

FIG. 6 is an illustrative method for monitoring power consumption in an integrated circuit in accordance with an embodiment of the present invention. It should be appreciated that the embodiment of FIG. 5B may be used as an example to illustrate the steps described below. At step 601, a power-savings operation is activated on monitoring circuitry by a control signal from a control circuit. As shown in FIG. 5B, monitoring circuitry 521 is part of power-savings circuitry 504. Control circuit 508 may control monitoring circuitry 521 (e.g., through SEL-BIT 515) to monitor power consumption associated with IO block 410A in integrated circuit 10.

At step 602, an IO signal is received using the monitoring circuitry and a multiplexer circuit. As shown in FIG. 5B, serializer circuits 506A-506B may receive an IO signal from circuitry not shown) in integrated circuit 10 and subsequently provide a stream of selected bits of the IO signal to monitoring circuitry 521, and the respective multiplexer circuits (e.g., multiplexer circuit 525A, multiplexer circuit 525B).

At step 603, power consumption associated with the IO block is monitored using monitoring circuitry based on the received IO signal. For example, as shown in FIG. 5B, monitoring circuitry 521 may monitor switching activities in serializer circuits 506A-506B by comparing a number of bit transitions (e.g., low-to-high or high-to-low state changes) of the received IO signal with a predetermined bit transition threshold. In one embodiment, a logic designer may determine the bit transition threshold for power-savings and store the predetermined bit transition threshold in a register within monitoring circuitry 521. For example, the predetermined bit transition threshold may be half of a total number of bits in the IO signal.

When the power-savings operation is activated, the monitoring circuitry (e.g., monitoring circuitry 521) may compare the received IO signal with a predetermined IO signal (e.g., an IO signal received from a previous signal cycle) to check whether the predetermined bit transition threshold is exceeded. When the number of bit transitions exceeds a predetermined bit transition threshold, the monitoring circuitry may generate a monitoring circuitry output at step 604.

At step 605, the multiplexer circuit may selectively couple an output signal to either the IO signal or an inverted version of the IO signal based on the monitoring circuitry output. As an example, as shown in FIG. 5B, when a monitoring circuitry output (e.g., CTRL 522) is asserted by monitoring circuitry 521 to multiplexer circuits 525A and 525B, multiplexer circuits 525A an 525B may select an output data signal from the inverted data signal path from inverted circuits 526A and 526B. Such a configuration may result in fewer bit transitions in the selected output data signal and may hence reduce power consumption during signal transmission from integrated circuit 10 to an external element (e.g., integrated circuit 215 of FIG. 4).

At step 606, an additional output signal is selected (e.g., using an additional multiplexer circuit) from the monitoring circuitry and a clock signal based on the control signal. In one embodiment, the IO block has a clock output that outputs a clock signal. For example shown in FIG. 4, each IO block 410A-410D may output a clock signal (e.g., clock signal 401A-410D) for signal synchronization. An off-chip element (e.g., integrated circuit 215), which is coupled to integrated circuit 10 may receive the data signal and the clock signal as timing reference. However, when the clock output is unused (e.g., when other circuitry in the integrated circuit is already synchronized), control circuit 508 may control the additional multiplexer circuit 528 (e.g., through SEL-BIT 515) to select CTRL 522 (if asserted by monitoring circuitry 521) instead of clock signal 401A as the resulting output bit signal. In one embodiment, the resulting output bit signal may serve as an indicator that determines whether the selected output data signal has been inverted from the power-savings operation.

Subsequently, selected output data signal and the selected output control bit signal are routed to an external integrated circuit at step 607. As shown in FIG. 5B, the selected output data signals (e.g., data_in 510A -510B) and the selected output control bit signal (e.g., clk_ps_out 512) are routed to circuitry (not shown) in integrated circuit 215 via interconnects 412A. Interconnects 412A, for example, may be microbumps.

Figure 7:
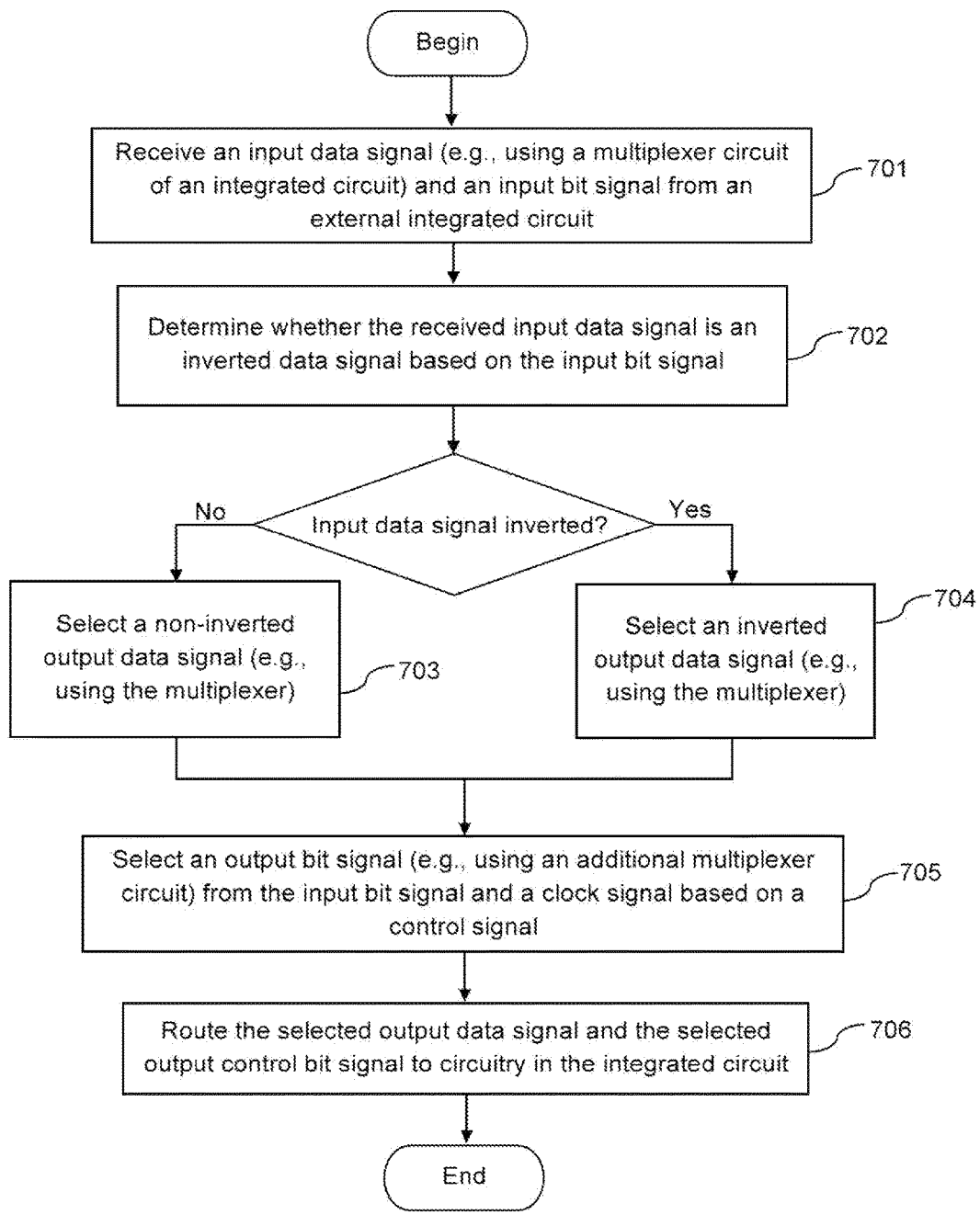
FIG. 7 is an illustrative method for performing a power saving operation on an integrated circuit in accordance with an embodiment of the present invention.

FIG. 7 is an illustrative method for performing a power saving operation on an integrated circuit in accordance with an embodiment of the present invention. It should be appreciated that the embodiment of FIG. 5C may be used as an example to illustrate the steps described below. At step 701, an input data signal and an input bit signal is received from an external integrated circuit using a multiplexer circuit in the integrated circuit. For example, as shown in FIG. 5C, input data signals (e.g., data_in 511A-511B) from an external integrated circuit (not shown) are driven into multiplexer structure 536A-536B and input bit signal clk_ps_in 513 may be driven into multiplexer circuit 527 and logic gate 538 (e.g., through input buffer circuit 552B).

At step 702, it is determined whether the received input data signal is an inverted data signal based on the input bit signal. For example, as shown in FIG. 5C, the received input bit signal (e.g., clk_ps_in 513) may be AND -ed together with SEL-BIT 515 (e.g., using logic gate 519) to assert a control signal (e.g., CTRL 539) to multiplexer circuits 535A and 535B. In one embodiment, CTRL 539 may control multiplexer structures 535A and 535B to select to select an inverted form of the received input data signal so that the correct output data signal (without inversion) can be transmitted to circuitry (not shown) within integrated circuit 10. As such, multiplexer circuits 585A -535B may select an inverted output data signal (e.g., through inverter circuits 236A-536B) when CTRL 539 is asserted at step 703. Otherwise, multiplexer circuits 535A-535B may select a non-inverted output data signal at step 704.

At step 705, an output bit signal is selected (e.g., using an additional multiplexer circuit) from the received input bit signal and a clock signal based on a control signal. As shown in FIG. 5C, control circuit 508 may control multiplexer circuit 527 (e.g., using SEL-BIT 515) to select from clk_ps_in 513 and clock signal 401A. In one embodiment, clk_ps_in 513 may be a clock signal from the external integrated circuit. In this case, clk_ps_in 513 is selected by multiplexer circuit 527 and transmitted to the circuitry in integrated circuit 10 to be used as a clock. In another embodiment, clk_ps_in 513 may be a select bit signal indicative of an inverted input data signal resulting from a power-savings operation performed in the external integrated circuit. In this case, as shown in FIG. 5C, clock signal 401A is passed back to other circuitry in integrated circuit 10 as timing reference.

Subsequently, the selected output data signal and the selected output control bit signal are routed to the circuitry in the integrated circuit at step 706. As shown in FIG. 5C, the selected output data signal and the selected output control bit signal are routed to the circuitry (not shown) in integrated circuit 10 via link 501.

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the date processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. Input-output (IO) circuitry, comprising:
monitoring circuitry that determines whether a predetermined threshold number of bits of an IO signal are transitioning from a first logical state to a second logical state;
an encoder circuit that generates an encoded IO signal in response to the monitoring circuitry indicating that the number of bits of the IO signal that are transitioning from the first logical state to the second logical state exceeds the predetermined threshold number, wherein transmitting the encoded IO signal requires less power than transmitting the IO signal; and
an output port of the IO circuitry that outputs a clock signal in a first mode of the IO circuitry and that outputs an additional IO signal bit that is associated with the encoded IO signal in a second mode of the IO circuitry.

2. The IO circuitry defined in claim 1, wherein the encoder circuit further comprising:
a multiplexer circuit that receives the IO signal and an inverted IO signal, wherein the multiplexer circuit is controlled by the monitoring circuitry to selectively couple an output signal to either the IO signal or the inverted IO signal.

3. The IO circuitry defined in claim 2, wherein the predetermined threshold number is half the number of bits in the IO signal, the monitoring circuitry further comprising:
circuitry for generating a monitoring circuitry output when the number of bit transitions exceeds half the number of bits in the IO signal; and
circuitry for selectively coupling the output signal to the inverted IO signal when the monitoring circuitry output indicates that the number of bit transitions exceeds half the number of bits in the IO signal.

4. The IO circuitry defined in claim 3 further comprising:
an additional multiplexer circuit that receives the monitoring circuitry output and a clock signal.

5. The IO circuitry defined in claim 4 further comprising:
a control circuit that activates the monitoring circuitry using a control signal, wherein the control signal is indicative of a power-savings operation.

6. The IO circuitry defined in claim 5, wherein the control circuit sends the control signal to the additional multiplexer circuit to select an output signal from the monitoring circuitry output and the clock signal.

7. Input-output (IO) circuitry, comprising:
a control circuit that produces a control signal, wherein the control signal is indicative of a power-savings operation; and
an encoder circuit that receives the IO signal and that has an enabled mode and a disabled mode, wherein the encoder circuit selectively generates an encoded IO signal in response to the control signal having a first value indicating a power-savings operation in the enabled mode, wherein the encoder circuit is disabled in response to the control signal having a second value in the disabled mode, and wherein the encoder circuit comprises:
multiplexer circuitry that receives the IO signal and an inverted IO signal, wherein the multiplexer circuitry is controlled by the control circuit to selectively couple an output signal to either the IO signal or the inverted IO signal.

8. The IO circuitry defined in claim 7, wherein further comprising:
a logic gate that receives the control signal an input bit signal, wherein the logic gate produces an enable signal based on at least the control signal and the input bit signal.

9. The IO circuitry defined in claim 8, wherein the logic gate sends the enable signal to the multiplexer circuit to select the inverted IO signal as the output signal.

10. An integrated circuit, comprising:
an input-output (IO) block coupled to a plurality of IO pins, wherein the plurality of IO pins produce an IO signal; and
monitoring circuitry that receives a control bit at a pin in the IO block in a first mode of the integrated circuit, and that receives a clock signal at the pin in a second mode of the integrated circuit, wherein the control bit indicates whether the IO signal is an inverted IO signal.

11. The integrated circuit defined in claim 10, wherein the monitoring circuitry compares the IO signal to a predetermined IO signal to determine whether a number of bit transitions in the IO signal exceeds a predetermined bit transition threshold during the power-savings operation, and further wherein the monitoring circuitry asserts a power reduction control signal when the number of bit transitions in the IO signal exceeds the predetermined bit transition threshold.

12. The integrated circuit defined in claim 11, further comprising:
a multiplexer circuit having first and second input terminals, wherein the first input terminal receives the IO signal from the IO block and the second input terminal receives an inverted IO signal, wherein the power reduction control signal controls the multiplexer circuit to selectively couple an output signal to either the IO signal or the inverted IO signal.

13. The integrated circuit defined in claim 12, further comprising:
an additional integrated circuit coupled to the integrated circuit, wherein the integrated circuit and the additional integrated circuit are mounted on an interposer, wherein the integrated circuit is placed adjacent to the additional integrated circuit, and wherein the additional integrated circuit receives the selected output signal from the integrated circuit.

14. The integrated circuit defined in claim 12, further comprising:
an additional integrated circuit coupled to the integrated circuit via microbumps, wherein the integrated circuit and the additional integrated circuit are stacked on each other to form a stack structure, and wherein the additional integrated circuit receives the selected output signal from the integrated circuit.

15. The integrated circuit defined in claim 10, further comprising:
a control circuit that provides a control signal to the monitoring circuitry over the pin, wherein the control signal activates the monitoring circuitry to perform a power-savings operation.

16. A method comprising:
with an input-output (IO) block coupled to a plurality of IO pins, producing an IO signal;
with control circuitry, initiating a power -savings operation by setting a control signal to a first value;
with monitoring circuitry, monitoring the power consumption associated with transmitting the IO signal monitoring switching activities of the plurality of bits of the IO signal; and
in response to the control signal having the first value, generating an encoded IO signal with an encoder circuit if the monitoring circuitry indicates that the majority of bits of the IO signal are transitioning from a first logical state to a second logical state, wherein transmitting the encoded IO signal requires lower power than transmitting the IO signal.

17. The method defined in claim 16, wherein generating the encoded IO signal further comprises:
with a multiplexer circuit, receiving the IO signal and an inverted IO signal, wherein the multiplexer circuit is controlled by the monitoring circuitry to selectively couple an output signal to either the IO signal or the inverted IO signal.

18. The method defined in claim 17, further comprising:
with a control circuit, controlling the monitoring circuitry to monitor the power consumption associated with the IO block using a control signal, wherein the control signal is indicative of a power-savings operation.

19. The method defined in claim 18, wherein monitoring the switching activities of the plurality of IO pins comprises:
with the monitoring circuitry, comparing a number of bit transitions in the IO signal with a predetermined bit transition threshold.

20. The method defined in claim 19, wherein the comparing the number of bit transitions in the IO signal with the predetermined bit transition threshold further comprising:
with the monitoring circuitry, generating a monitoring circuitry output when the number of bit transitions in the IO signal exceeds the predetermined bit transition threshold.

21. The method defined in claim 20, further comprising:
with an additional multiplexer, receiving the monitoring circuitry output and a clock signal and selecting an additional output signal from the monitoring circuitry output and the clock signal based on the control signal.

* * * * *